(12) United States Patent
Liao

(10) Patent No.: US 11,302,541 B2
(45) Date of Patent: Apr. 12, 2022

(54) CARRIER STRUCTURE AND CARRIER DEVICE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 0 days.

(21) Appl. No.: 16/520,398

(22) Filed: Jul. 24, 2019

(65) Prior Publication Data

US 2020/0286758 A1 Sep. 10, 2020

(30) Foreign Application Priority Data

Mar. 8, 2019 (TW) ................................ 108107747

(51) Int. Cl.
*H01L 21/67* (2006.01)
*H01L 23/34* (2006.01)
(Continued)

(52) U.S. Cl.
CPC ...... *H01L 21/67144* (2013.01); *H01L 23/345* (2013.01); *H01L 23/49816* (2013.01); *H01L 24/27* (2013.01); *H01L 2924/12041* (2013.01); *H01L 2924/12042* (2013.01); *H01L 2924/14* (2013.01)

(58) Field of Classification Search
CPC ............................ H01L 23/498–49894; H01L 2224/16155–16168; H01L 2224/16225–1624; H01L 2224/8085–8089; H01L 2224/8185–8189; H01L 21/673–67396; H01L 23/32

See application file for complete search history.

(56) References Cited

U.S. PATENT DOCUMENTS

| 2005/0098610 A1* | 5/2005 | Onobori | B23K 1/0016 228/180.21 |
| 2013/0040424 A1* | 2/2013 | Bayerer | H01L 24/83 438/107 |

(Continued)

FOREIGN PATENT DOCUMENTS

| CN | 102931123 | 2/2013 |
| CN | 104145328 | 11/2014 |

(Continued)

OTHER PUBLICATIONS

"Office Action of China Counterpart Application", dated Aug. 20, 2021, p. 1-p. 9.

(Continued)

*Primary Examiner* — Moazzam Hossain
*Assistant Examiner* — Stanetta D Isaac
(74) *Attorney, Agent, or Firm* — JCIPRNET

(57) ABSTRACT

The present invention provides a chip carrier structure including: a non-circuit substrate, a plurality of micro heaters, and an adhesive layer. The micro heaters are disposed on the non-circuit substrate. The adhesive layer is disposed on the micro heaters, and a plurality of chips are disposed on the adhesive layer. Thereby, the present invention improves the solder yield of the process by a wafer carrying structure and a wafer carrying device.

18 Claims, 9 Drawing Sheets

(51) Int. Cl.
    *H01L 23/498*    (2006.01)
    *H01L 23/00*     (2006.01)

(56) References Cited

U.S. PATENT DOCUMENTS

| | | | |
|---|---|---|---|
| 2013/0134606 A1 | 5/2013 | Im et al. | |
| 2016/0049381 A1 | 2/2016 | Ryu et al. | |
| 2016/0172253 A1 | 6/2016 | Wu et al. | |
| 2017/0278734 A1 | 9/2017 | Zou et al. | |
| 2018/0130683 A1* | 5/2018 | Hendriks | .......... H01L 21/67356 |

FOREIGN PATENT DOCUMENTS

| | | |
|---|---|---|
| CN | 104904001 | 9/2015 |
| CN | 107154374 | 9/2017 |
| TW | 201347054 | 11/2013 |
| TW | 201425207 | 7/2014 |
| TW | 201438080 | 10/2014 |
| TW | 201606969 | 2/2016 |
| TW | I618157 | 3/2018 |
| TW | 201818479 | 5/2018 |
| WO | 2016175654 | 11/2016 |

OTHER PUBLICATIONS

"Office Action of Taiwan Counterpart Application", dated Jul. 11, 2019, p. 1-p. 4.
"Office Action of Taiwan Counterpart Application", dated Mar. 25, 2020, p. 1-p. 4.
"Office Action of Taiwan Counterpart Application", dated Dec. 11, 2020, p. 1-p. 5.

\* cited by examiner

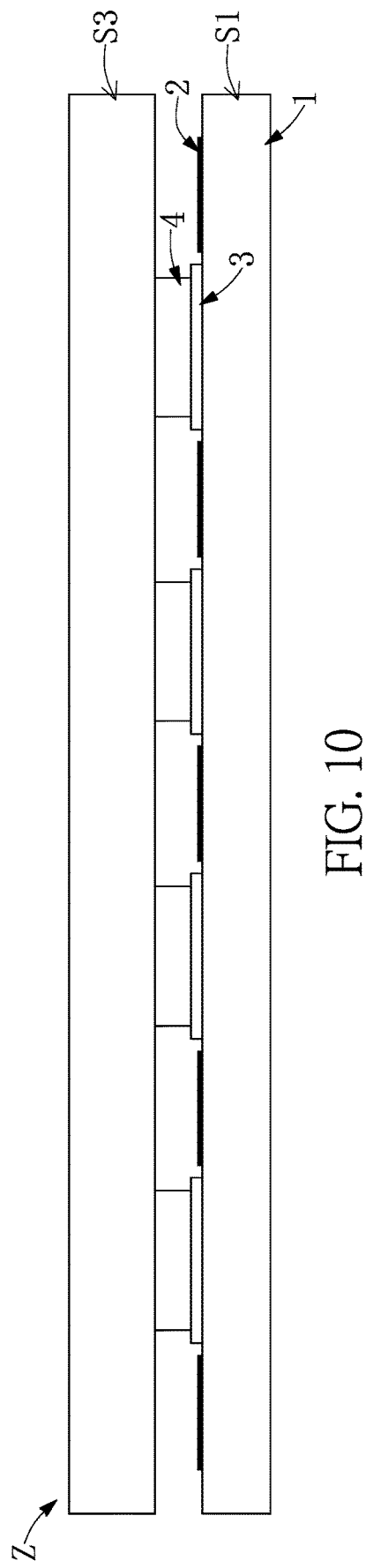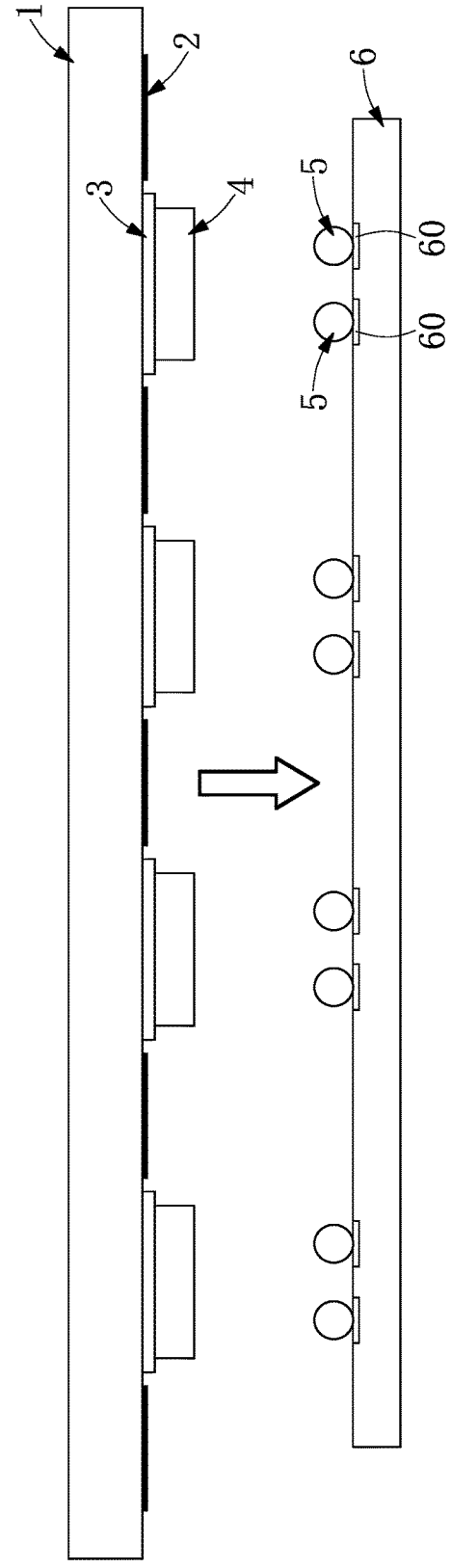

CARRIER STRUCTURE AND CARRIER DEVICE

CROSS-REFERENCE TO RELATED PATENT APPLICATION

This application claims the benefit of priority to Taiwan Patent Application No. 108107747, filed on Mar. 8, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a carrier structure and a carrier device, and more particularly to and more particularly to a chip carrier structure and a chip carrier device.

BACKGROUND OF THE DISCLOSURE

In recent years, with the rapid development of electronic and semiconductor technologies, electronic products have been continuously modernized, and are designed to be light, thin, short, and small. Circuit boards are widely used in various electronic devices. The surface of the circuit board usually has a plurality of solder pads. In the process, solders are formed on the solder pads of the circuit board, and then various electronic components are mounted onto the circuit board by a reflow process, and thus each electronic component is electrically connected to each other through a circuit layer in the circuit board.

At present, the reflow process can be performed by using different reheating methods such as a reflow furnace, an infrared heating lamp or a heat gun. Although the above-mentioned reheating treatment method generally meets the requirements of use, there is still a need to improve the yield and performance and reduce the production cost.

SUMMARY OF THE DISCLOSURE

In response to the above-referenced technical inadequacies, the present disclosure provides a chip carrier structure and a chip carrier device.

In one aspect, the present disclosure provides a chip carrier structure including: a non-circuit substrate, a plurality of micro heaters, and an adhesive layer. The micro heaters are disposed on the non-circuit substrate. The adhesive layer is disposed on the micro heaters, and a plurality of chips are disposed on the adhesive layer.

In one aspect, the present disclosure provides a chip carrier structure including: a non-circuit substrate and at least one micro heater. The non-circuit substrate carries at least one chip. The micro heater is carried by the non-circuit substrate to heat at least one the solder ball that the chip is in contact with.

In one aspect, the present disclosure provides a chip carrier device including: a chip carrier structure and a suction structure. The chip carrier structure includes a non-circuit substrate and at least one micro heater carried by the non-circuit substrate. The suction structure is disposed above the chip carrier structure to suction and transfer at least one chip to the chip carrier structure. The chip is carried by the non-circuit substrate, and at least one micro heater heats at least one the solder ball that the chip is in contact with.

Therefore, one of the beneficial effects of the present disclosure is that, by the technical features of "a plurality micro heaters disposed on a non-circuit substrate" and "an adhesive layer disposed on the micro heaters, and a plurality of chips disposed on the adhesive layer," the soldering yield can be improved.

Another beneficial effect of the present disclosure is that, by the technical features of "a non-circuit substrate carrying at least one chip" and "at least one micro heater is carried by the non-circuit substrate to heat at least one solder ball that the chip is in contact with" improve the soldering yield can be improved.

Yet another beneficial effect of the present disclosure is that, by the technical features of "a chip carrier structure including a non-circuit substrate and at least one micro heater carried by the non-circuit substrate," "a suction structure is disposed above the chip carrier structure to suction and transfer at least one chip to the chip carrier structure" and "the chip carried by the non-circuit substrate, and the micro heater heats at least one solder ball that the chip is in contact with" the soldering yield can be improve.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 10 is a front view of a chip carrier device according to a second embodiment of the present disclosure.

FIG. 11 is a schematic view of chip carrier structure according to the second embodiment of the present disclosure in use.

DETAILED DESCRIPTION OF THE EXEMPLARY EMBODIMENTS

Figure 1:
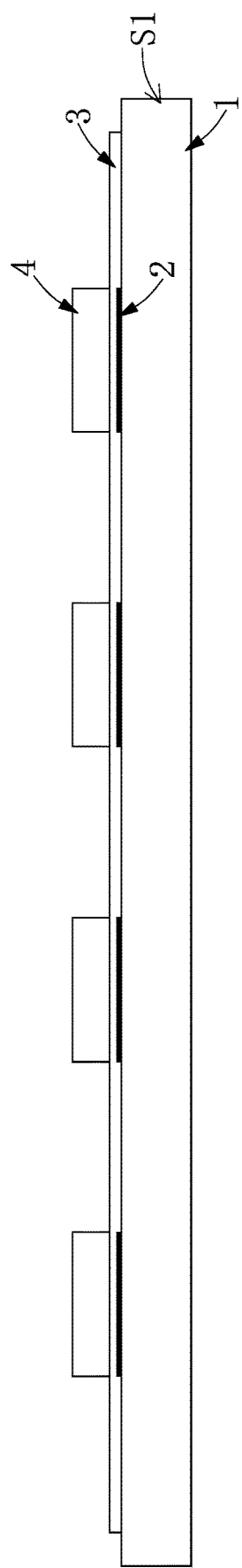
FIG. 1 is a schematic view of a chip carrier structure according to a first embodiment of the present disclosure in use.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 9, a first embodiment of the present disclosure provides a chip carrier structure S1 including a non-circuit substrate 1, a plurality of micro heaters 2, and an adhesive layer 3. The micro heaters 2 are disposed on the non-circuit substrate 1. The adhesive layer 3 is disposed on the micro heaters 2, and a plurality of chips 4 are disposed on the adhesive layer 3.

Firstly, as shown in FIG. 1, the chip carrier structure S1 of the present disclosure includes the non-circuit substrate 1, the plurality of micro heaters 2, and the adhesive layer 3. The non-circuit substrate 1 may be a single substrate or a composite substrate. For example, the single substrate may be glass, quartz, sapphire, ceramic or wafer, but the present disclosure is not limited thereto. The non-circuit substrate 1 has the plurality of micro heaters 2 arranged at intervals. The plurality of micro heaters 2 can be arranged in series or in parallel, and electrically connected to a power supply end (for example, a mains or a main unit, but the present disclosure is not limited thereto), and the micro heater 2 can be disposed on the surface of the non-circuit substrate 1 or embedded in the non-circuit substrate 1, but the present disclosure is not limited thereto. The adhesive layer 3 is also disposed on the non-circuit substrate 1, which covers the micro heaters 2. Each of the plurality of chips 4 respectively corresponds to one of the micro heaters 2 and is located on the adhesive layer 3, that is, the chips 4 are respectively disposed above the micro heaters 2, and the chips 4 can be IC chips or LED chips, but the present disclosure is not limited thereto. The adhesive layer 3 may be one of polyetheretherketone (PEEK), benzocyclobutene (BCB), and hydrogen silsesquioxane (HSQ), but the present disclosure is not limited thereto.

Figure 2:
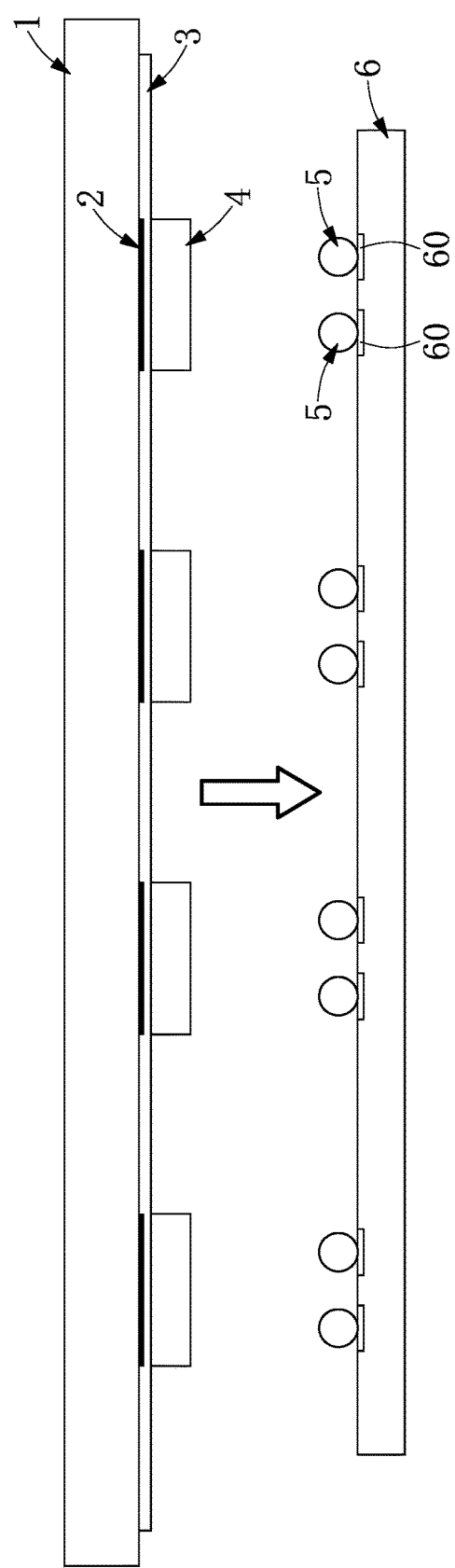
FIG. 2 is a schematic view of the chip carrier structure according to the first embodiment of the present disclosure in use

Next, as shown in FIG. 2, a circuit substrate 6 is provided, and the circuit substrate 6 further includes a plurality of solder pads 60. At least one solder ball 5, or other types of electrically conductive materials, can be placed on each of the solder pads 60. Further, one side of the non-circuit substrate 1 provided with the plurality of chips 4 may be provided with one side the circuit substrate 6 disposed with the plurality of solder pads 60 and approach toward the circuit substrate 6. The present disclosure can drive the non-circuit substrate 1 toward the circuit substrate 6 through a pick-and-place module (not shown, for example, a vacuum nozzle or any kind of pick and place machine), so that the chips 4 correspond to the two solder ball 5. However, the above-mentioned examples are only one of the embodiments and the present disclosure is not limited thereto.

Figure 3:
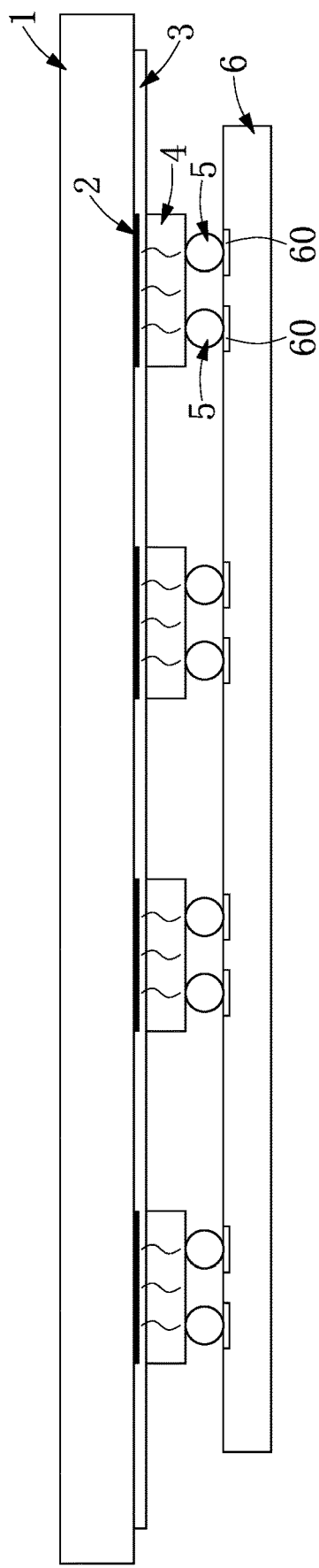
FIG. 3 is a schematic view of the chip carrier structure according to the first embodiment of the present disclosure in use.

Finally, as shown in FIG. 3, each of the micro heaters 2 heats at least one of the chips 4 so that the chip 4 is mounted onto the circuit substrate 6 by the solder balls 5 and is detached from the adhesive layer 3. For example, each chip 4 is disposed on the two solder balls 5. After supplying electric energy to the plurality of micro heaters 2, each of the micro heaters 2 heats the corresponding chip 4 to heat the solder balls 5 so that the solder balls 5 are softened and thus generating a connection with the chip 4. Then, after the solder balls 5 is cured, the chip 4 is mounted onto the circuit substrate 6 and electrically connected to the circuit substrate 6 through the solder ball 5, and the chip 4 is detached from the non-circuit substrate 1.

It should be noted that the non-circuit substrate 1 of the present disclosure may be provided with a feedback circuit unit (not shown, which is mainly composed of a driving circuit, a signal reading circuit, and a temperature control circuit) for controlling the heating temperature of the micro heater 2.

Figure 4:
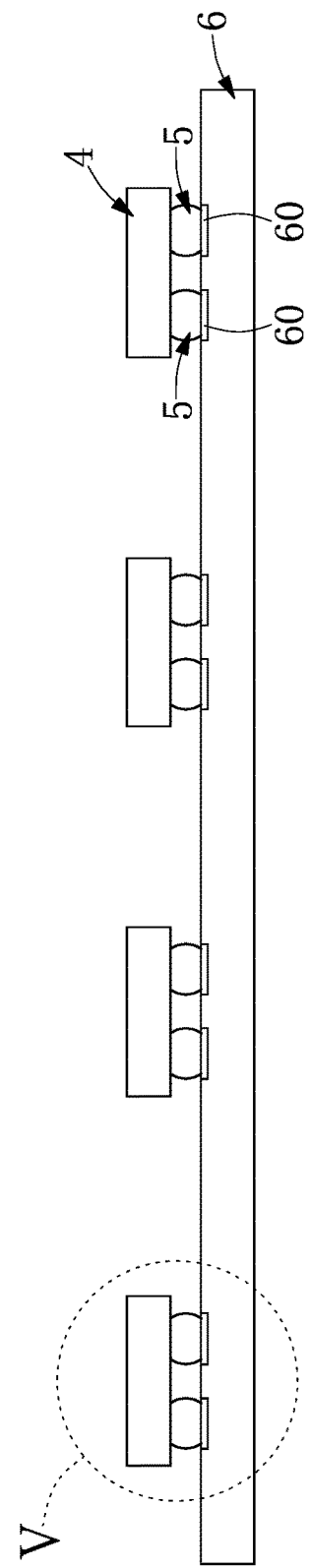
FIG. 4 is a fourth schematic view of the chip carrier structure according to the first embodiment of the present disclosure in use.
Figure 5:
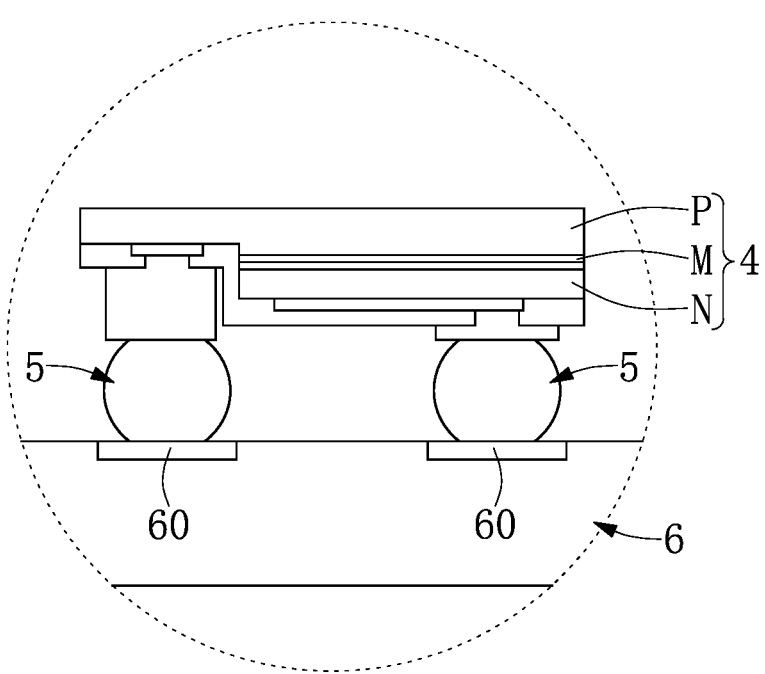
FIG. 5 is an enlarged schematic view of a portion V of FIG. 4.

Further, as shown in FIG. 4 and FIG. 5, each chip 4 may be a micro-semiconductor light-emitting element (micro LED) including an n-type conductive layer N disposed in a stack, a light-emitting layer M traversable by a laser source L, and a p-type conductive layer P. The n-type conductive layer N may be an n-type gallium nitride material layer or an n-type gallium arsenide material layer, the light-emitting layer M may be a multi-quantum well structure layer, and the p-type conductive layer P may be a p-type gallium nitride material layer or a p-type gallium arsenide material layer. Alternatively, each chip 4 may also be a sub-millimeter LED (mini LED) including a base layer (not shown) disposed in a stack, an n-type conductive layer N, and a laser source L passing through the light-emitting layer M and a p-type conductive layer P. The base layer may be a sapphire material layer, the n-type conductive layer N may be an n-type gallium nitride material layer or an n-type gallium arsenide material layer, the light-emitting layer M is a multi-quantum well structure layer, and the p-type conductive layer P may be a p-type gallium nitride material layer or a p-type gallium arsenide material layer. The base layer may also be a quartz base layer, a glass base layer, a tantalum base layer or a base layer of any material. However, the above-mentioned examples are only one of the embodiments and the present disclosure is not limited thereto.

Figure 6:
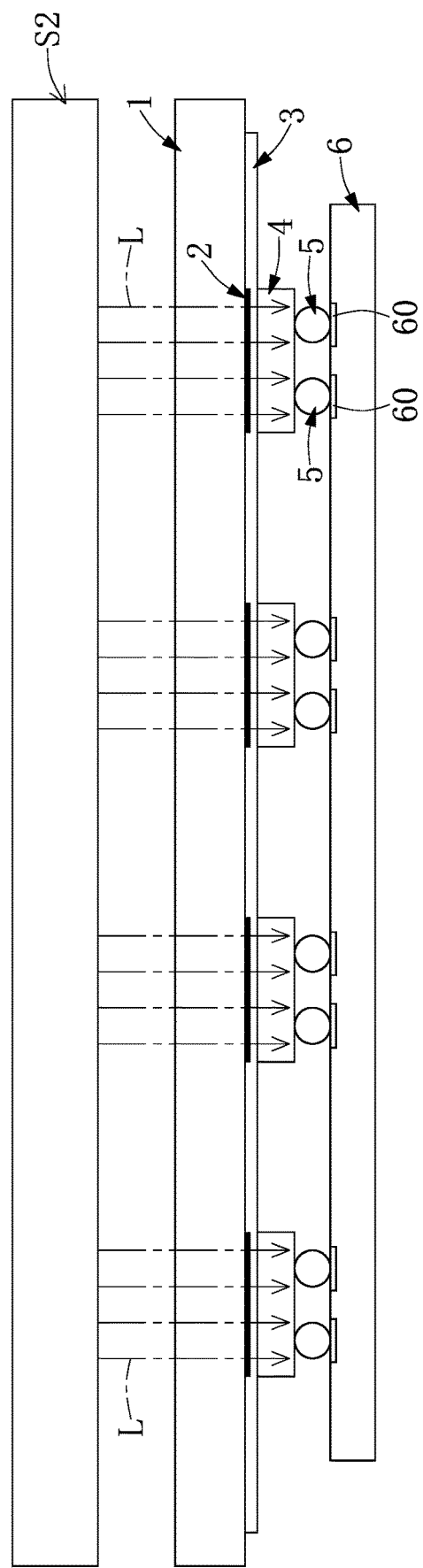
FIG. 6 is a fifth schematic view of the chip carrier structure according to the first embodiment of the present disclosure in use.
Figure 7:
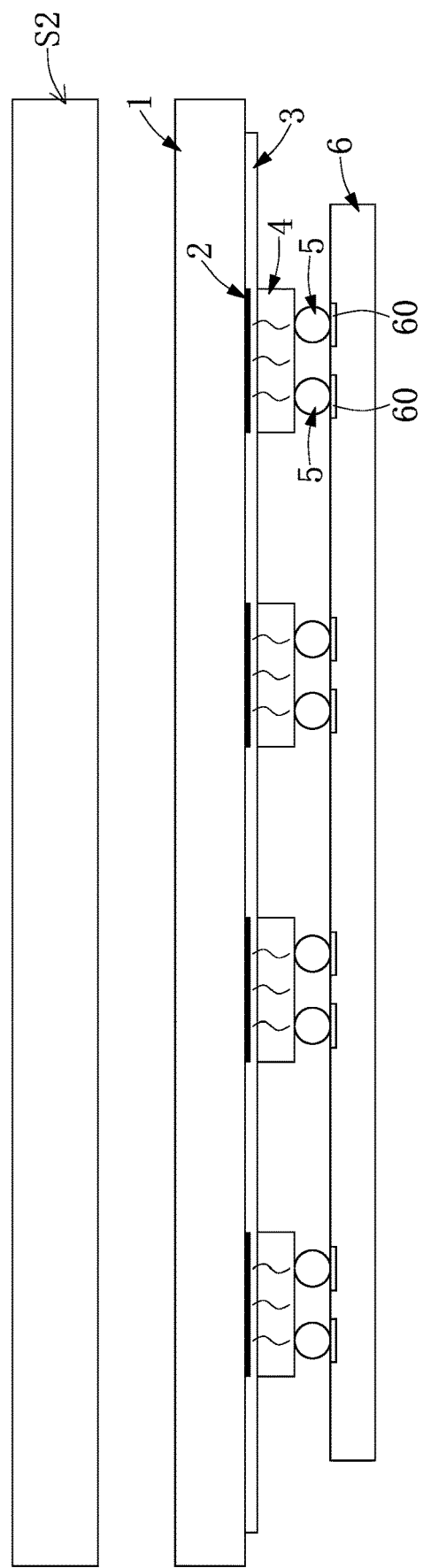
FIG. 7 is a sixth schematic view of the chip carrier structure according to the first embodiment of the present disclosure in use.

Further, as shown in FIG. 6 and FIG. 7, before each micro heater 2 heats the corresponding chip 4, a light can be projected toward the solder ball 5 through a laser heating module S2. For example, the light passes through the n-type conductive layer N, the light-emitting layer M and the p-type conductive layer P of the chip 4, and is projected onto the solder ball 5 on the circuit substrate 6. By preheating the solder ball 5 through the laser heating module S2, and heating the solder ball 5 by the micro heater 2, the voltage supplied to the micro heater 2 can be greatly reduced; that is, preheating the solder ball 5 through the laser source L can greatly reduce the temperature preset value of the micro heater 2 that is to be instantaneously increased. For example, in the situation where only the heater 2 is heated by the micro heater 2, the temperature at which the micro heater 2 is instantaneously raised is preset to 700 degrees, and in the situation where the laser source L preheats the solder ball 5, the temperature at which the micro heater 2 is instantaneously raised is preset to 400 degrees or lower. However, the above-mentioned examples are only one of the embodiments and the present disclosure is not limited thereto.

Figure 8:
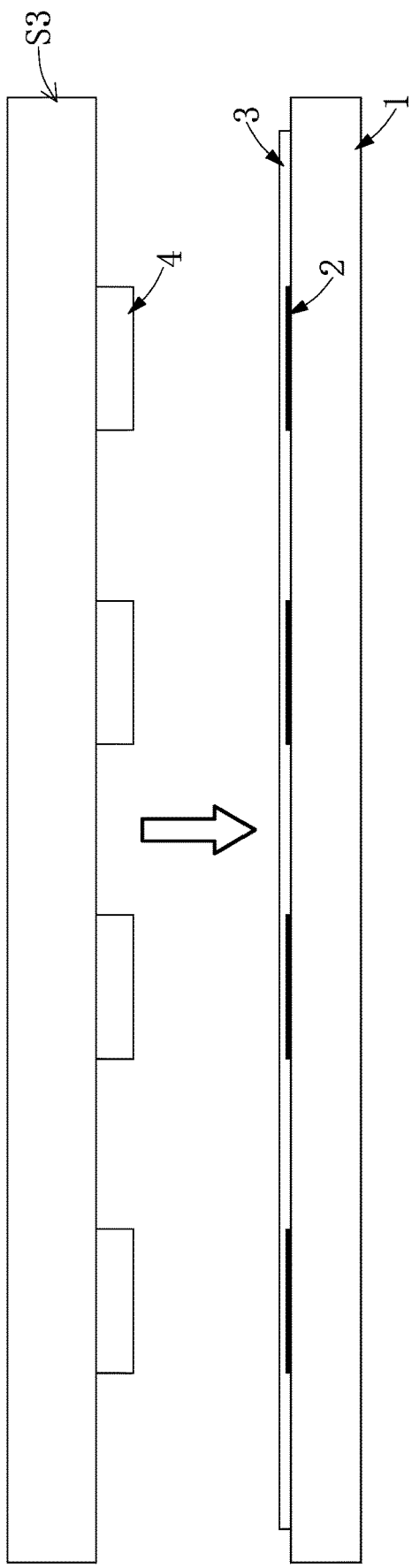
FIG. 8 is a seventh schematic view of the chip carrier structure according to the first embodiment of the present disclosure in use.
Figure 9:
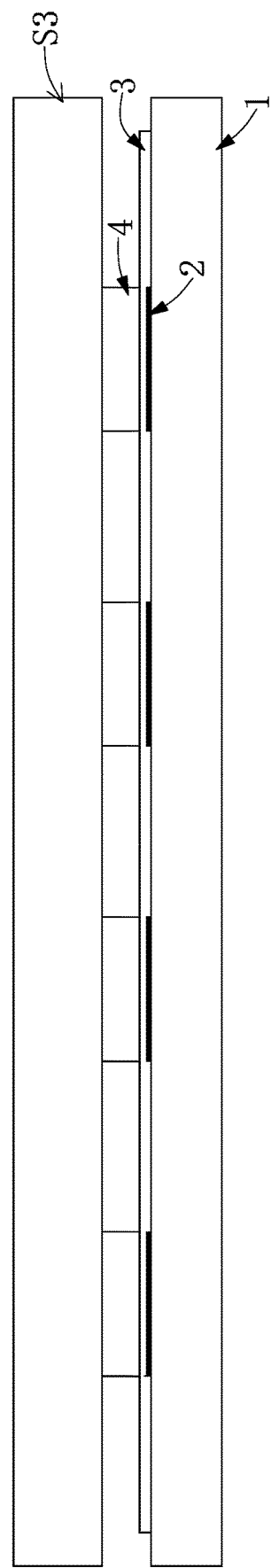
FIG. 9 is an eighth schematic view of the chip carrier structure according to the first embodiment of the present disclosure in use.

Further, as shown in FIG. 8 and FIG. 9, at least one chip 4 of the present disclosure can be suctioned and transferred to the chip carrier structure S1 through a suction structure S3 disposed above the chip carrier structure S1. For example, the present disclosure may firstly use one suction structure S3 (which may be a vacuum nozzle module or an electrostatic adsorption module, but the present disclosure is not limited thereto) to suction one or more chips 4 using the opposite charge suction; the above-mentioned examples are only one of the embodiments and the present disclosure is not limited thereto. Next, the chip 4 is placed on chip carrier structure S1 by the suction structure S3. Finally, the suction structure S3 cancels the suction force of the opposite charge so that the chip 4 is connected to the chip carrier structure S1.

However, the above-mentioned examples are only one of the embodiments and the present disclosure is not limited thereto.

Second Embodiment

Referring to FIG. 10 to FIG. 14 and also referring to FIG. 1 to FIG. 9, a second embodiment of the present disclosure provides the chip carrier structure S1 that is slightly similar to the chip carrier structure S1 of the first embodiment. Therefore, similar steps will not be repeated herein. The difference between the second embodiment of the present disclosure and the first embodiment is that the chip carrier structure S1 of the present embodiment includes the non-circuit substrate 1 and at least one micro heater 2. The non-circuit substrate 1 carries at least one chip 4. The micro heater 2 is carried by the non-circuit substrate 1 to heat at least one solder ball 5 that is in contact with the chip 4.

For example, as shown in FIG. 10, one or more chips 4 of the present disclosure can be suctioned with a suction force of opposite charges through a suction structure S3 disposed above the chip carrier structure S1; then, the chip 4 is placed on the chip carrier structure S1 by the suction structure S3, and the suction force of the opposite charge is canceled, and thus the chip 4 is connected to the chip carrier structure S1. Further, the non-circuit substrate 1 is provided with a plurality of micro heaters 2, part of the micro heaters 2 are located between the adjacent two chips 4, and the other part of the micro heaters 2 is located at the side of the chip 4. The micro heater 2 may not cover the adhesive layer 3, but the present disclosure is not limited thereto.

Next, as shown in FIG. 11, one side of the non-circuit substrate 1 on which the plurality of chips 4 are disposed on is provided with one surface disposed with the plurality of solder pads 60 facing toward the circuit substrate 6, and is approaching toward the circuit substrate 6. At least one solder ball 5, or other type of electrically conductive material, can be disposed on each solder pad 60.

Figure 12:
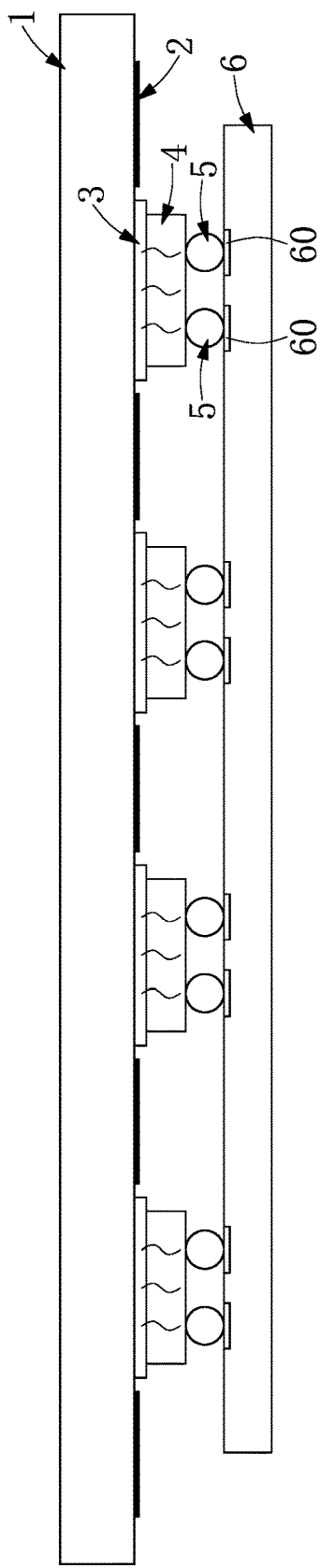
FIG. 12 is a schematic view of the chip carrier structure according to the second embodiment of the present disclosure in use.

Finally, as shown in FIG. 12, by supplying electric energy to each of the micro heaters 2 on the non-circuit substrate 1, each of the micro heaters 2 heats the at least one chip 4 to indirectly heat at least one solder ball 5 that is in contact with the chip 4, thereby softening the solder ball 5. Therefore, the solder ball 5 is softened and then connected to the chip 4. After the solder ball 5 is cured, the chip 4 is mounted onto the circuit substrate 6 and electrically connected to the circuit substrate 6 through the solder ball 5, and the chip 4 is detached from the non-circuit substrate 1.

Figure 13:
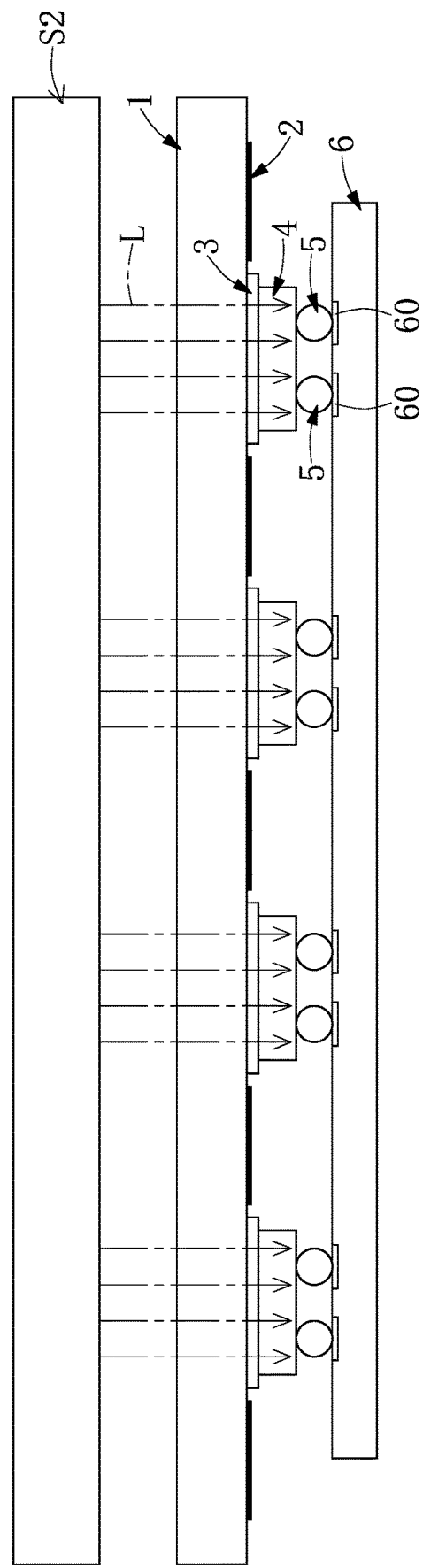
FIG. 13 is a third schematic view of the chip carrier structure according to the second embodiment of the present disclosure in use.

Further, as shown in FIG. 13, before each micro heater 2 heats the corresponding chip 4, the light generated by a laser source L can be projected toward the solder ball 5 through a laser heating module S2. For example, the light passes through the chip 4 and is projected onto the solder ball 5 on the circuit substrate 6. By preheating the solder ball 5 by the laser heating module S2, and heating the solder ball 5 by the micro heater 2, the voltage supplied to the micro heater 2 can be greatly reduced; that is, preheating the solder ball 5 through the laser source L can greatly reduce the temperature preset value of the micro heater 2 to be instantaneously increased. For example, in the situation where only the heater 2 is heated by the micro heater 2, the temperature at which the micro heater 2 is instantaneously raised is preset to 700 degrees, and in the situation where the laser source L preheats the solder ball 5, the temperature at which the micro heater 2 is instantaneously raised is preset to 400 degrees or lower. However, the above-mentioned examples are only one of the embodiments and the present disclosure is not limited thereto.

Figure 14:
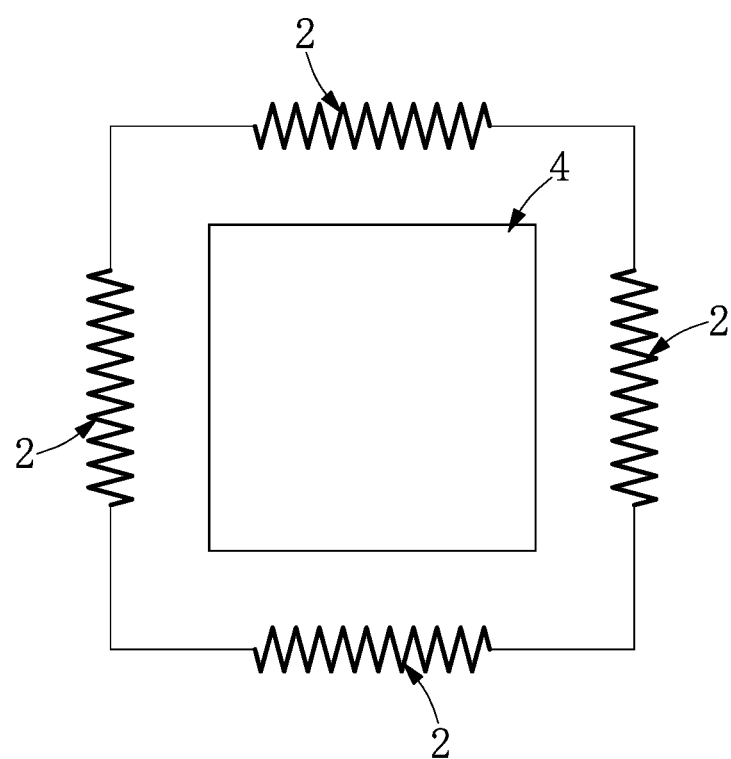
FIG. 14 is a schematic structural view of a micro heater and a chip of a chip carrier structure according to the second embodiment of the present disclosure in use.

Further, as shown in FIG. 14, the micro heater 2 of the present disclosure may be disposed on the periphery of the chip 4, or may be disposed on at least two sides of the chip 4, for example, opposite sides, but the present disclosure is not limited thereto.

In addition, as shown in FIG. 10 to FIG. 14, the present disclosure further provides a chip carrier device Z, which includes: the chip carrier structure S1 and a suction structure S3. The chip carrier structure S1 includes the non-circuit substrate 1 and at least one micro heater 2 carried by the non-circuit substrate 1. The suction structure S3 is disposed above the chip carrier structure S1 to suction and transfer at least one chip 4 to the chip carrier structure S1. The chip 4 is carried by the non-circuit substrate 1, and the micro heater 2 heats at least one solder ball 5 that is in contact with the chip 4.

However, the above-mentioned examples are only one of the embodiments and the present disclosure is not limited thereto.

In conclusion, one of the beneficial effects of the present disclosure is that, by the technical features of "a plurality micro heaters 2 disposed on a non-circuit substrate 1" and "an adhesive layer 3 disposed on the micro heaters 2, and a plurality of chips 4 disposed on the adhesive layer 3," the soldering yield can be improved.

Another beneficial effect of the present disclosure is that, by the technical features of "a non-circuit substrate 1 carrying at least one chip 4" and "at least one micro heater 2 is carried by the non-circuit substrate 1 to heat at least one solder ball 5 that the chip 4 is in contact with" the soldering yield can be improve.

Yet another beneficial effect of the present disclosure is that, by the technical features of "a chip carrier structure S1 including a non-circuit substrate 1 and at least one micro heater 2 carried by the non-circuit substrate 1," "a suction structure S3 is disposed above the chip carrier structure S1 to suction and transfer at least one chip 4 to the chip carrier structure S1" and "the chip 4 carried by the non-circuit substrate 1, and the micro heater 2 heats at least one solder ball 5 that the chip 4 is in contact with" the soldering yield can be improved.

Further, the chip carrier structure S1 and the chip carrier device Z provided by the present disclosure use the micro heater 2 on the chip carrier structure S1 to heat the solder ball 5 on the circuit substrate 6 to improve the soldering yield. In addition, the present disclosure can further preheat the solder ball 5 with the laser source L generated by the laser heating module S2, so that the temperature at which the micro heater 2 is instantaneously raised can be greatly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A carrier structure, comprising:
   a non-circuit substrate;
   a plurality of micro heaters disposed on a same surface of the non-circuit substrate; and
   an adhesive layer disposed on the non-circuit substrate for covering all of the plurality of micro heaters, and
   a plurality of electronic components disposed on the adhesive layer, wherein:
   the plurality of micro heaters are configured for melting a solder to be formed between a circuit substrate and the plurality of electronic components,
   the non-circuit substrate is electrically insulated from the plurality of electronic components, and
   the plurality of electronic components are electrically connected with the circuit substrate through the solder and a corresponding pad of the circuit substrate.

2. The carrier structure according to claim 1, wherein the non-circuit substrate is a single substrate or a composite substrate.

3. The carrier structure according to claim 1, wherein the plurality of electronic components are respectively disposed above the plurality of micro heaters and the plurality of electronic components include an IC chip or an LED chip.

4. The carrier structure according to claim 1, wherein each of the micro heater heats at least one electronic component so that the electronic component is mounted onto the circuit substrate by the solder and is detached from the adhesive layer.

5. A carrier structure, comprising:
   a non-circuit substrate carrying at least one electronic component and the non-circuit substrate is electrically insulated from the at least one electronic component;
   at least one micro heater carried by the non-circuit substrate for heating at least one solder that is in contact with the at least one electronic component, wherein the at least one micro heater is configured for melting the at least one solder to be formed between a circuit substrate and the at least one electronic component, and the at least one electronic component is electrically connected with the circuit substrate through the at least one solder and a corresponding pad of the circuit substrate; and
   an adhesive layer disposed on the non-circuit substrate and beside the at least one micro heater.

6. The carrier structure according to claim 5, wherein at least one electronic component is mounted onto the circuit substrate by the at least one solder and is detached from the non-circuit substrate.

7. The canier structure according to claim 5, wherein the at least one electronic component includes an IC chip or an LED chip, and the non-circuit substrate is glass, quartz, sapphire, ceramic or a wafer.

8. A carrier device, comprising:
   a suction structure configured to suction and transfer at least one electronic component to a carrier structure, wherein the carrier structure including a non-circuit substrate and at least one micro heater carried by the non-circuit substrate; and
   a laser heating module disposed above the carrier structure to project a laser source on the solder;
   wherein the at least one electronic component is carried by the non-circuit substrate, and the at least one micro heater heats at least one solder that is contact with the at least one electronic component, wherein:
   the at least one micro heater is configured for melting the solder to be formed between a circuit substrate and the at least one electronic component,
   the non-circuit substrate is electrically insulated from the at least one electronic component, and
   the at least one electronic component is electrically connected with the circuit substrate through the solder and a corresponding pad of the circuit substrate.

9. The carrier device according to claim 8, wherein the at least one electronic component passes through the solder to be mounted onto the circuit substrate and to be detached from the non-circuit substrate; wherein the at least one electronic component includes an IC chip or an LED chip, and the non-circuit substrate is glass, quartz, sapphire, ceramic or a wafer; wherein the suction structure is a vacuum nozzle module or an electrostatic suction module.

10. A carrier structure, wherein the carrier structure at least adapts to carry at least one electronic component, comprising:
    a non-circuit substrate, wherein the non-circuit substrate is electrically insulated from the at least one electronic component; and
    at least one micro heater formed at the non-circuit substrate, wherein the at least one micro heater is configured for melting at least one solder to be formed between a circuit substrate and the at least one electronic component, and the at least one electronic component is electrically connected with the circuit substrate through the at least one solder and a corresponding pad of the circuit substrate.

11. The carrier structure according to claim 10, wherein the carrier structure further comprises an adhesive layer, the adhesive layer is configured to bond the at least one electronic component to the non-circuit substrate, and the at least one micro heater is configured to heat the at least one electronic component.

12. The carrier structure according to claim 11, wherein the adhesive layer covers the at least one micro heater, and a portion of the adhesive layer is configured between the at least one electronic component and the at least one micro heater.

13. The carrier structure according to claim 12, wherein the at least one micro heater is configured to align with the at least one electronic component.

14. The carrier structure according to claim 11, wherein the at least one micro heater is not covered by the adhesive layer.

15. The carrier structure according to claim 14, wherein the at least one micro heater is configured to be misaligned with the at least one electronic component.

16. The carrier structure according to claim 11, wherein the at least one micro heater includes a plurality of micro heaters, and the plurality of micro heaters are disposed at at least two sides of a periphery of the at least one electronic component.

17. The carrier structure according to claim 16, wherein the plurality of micro heaters are arranged in series or in parallel.

18. The carrier structure according to claim 10, wherein the non-circuit substrate is glass, quartz, sapphire, ceramic or a wafer.

* * * * *